(12) United States Patent
Kinser et al.

(10) Patent No.: US 9,738,517 B2
(45) Date of Patent: Aug. 22, 2017

(54) MOLD FOR FORMING COMPLEX 3D MEMS COMPONENTS

(71) Applicants: International Business Machines Corporation, Armonk, NY (US); Yale University, New Haven, CT (US)

(72) Inventors: Emily R. Kinser, Poughkeepsie, NY (US); Jan Schroers, Hamden, CT (US); Golden Kumar, Lubbock, TX (US)

(73) Assignees: International Business Machines Corporation, Armonk, NY (US); Yale University, New Haven, CT (US)

( * ) Notice: Subject to any disclaimer, the term of this patent is extended or adjusted under 35 U.S.C. 154(b) by 172 days.

(21) Appl. No.: 14/839,324

(22) Filed: Aug. 28, 2015

(65) Prior Publication Data

US 2015/0368100 A1    Dec. 24, 2015

Related U.S. Application Data

(62) Division of application No. 13/778,526, filed on Feb. 27, 2013, now Pat. No. 9,249,015.

(51) Int. Cl.
*B81C 99/00* (2010.01)
*B22C 9/06* (2006.01)

(52) U.S. Cl.
CPC .............. *B81C 99/009* (2013.01); *B22C 9/06* (2013.01)

(58) Field of Classification Search
CPC ................................. B81C 99/009; B22C 9/06
USPC ........................................ 156/153, 154, 281
See application file for complete search history.

(56) References Cited

PUBLICATIONS

Bradt, et al, "Micromolding three-dimensional amorphous metal structures", J. Mater. Res., vol. 22, No. 2, Feb. 2007, pp. 339-343.*
Prosecution History of related U.S. Appl. No. 13/778,526, Amendment After Final Rejection, mailed Sep. 25, 2015, all pages.

* cited by examiner

*Primary Examiner* — Jeff Aftergut
(74) *Attorney, Agent, or Firm* — Law Offices of Ira D. Blecker, P.C.

(57) ABSTRACT

A mold structure having high-precision multi-dimensional components which includes a first oxide layer superimposed on a top of a first semiconductor substrate; a second oxide layer superimposed on a top of a second semiconductor substrate; integrated designs patterned in at least one of the oxide layers; and the first and second semiconductor substrates bonded to one another into a three dimensional (3D) mold such that the first oxide layer only makes partial contact with the second oxide layer such that a portion of the first oxide layer avoids contact with the second oxide layer, the portion of the first oxide layer directly opposite a surface portion of the second semiconductor substrate that is free of the second oxide, the 3D mold selectively filled with a filling material to form a molded high-precision multi-dimensional component.

15 Claims, 4 Drawing Sheets

BONDED SUBSTRATE

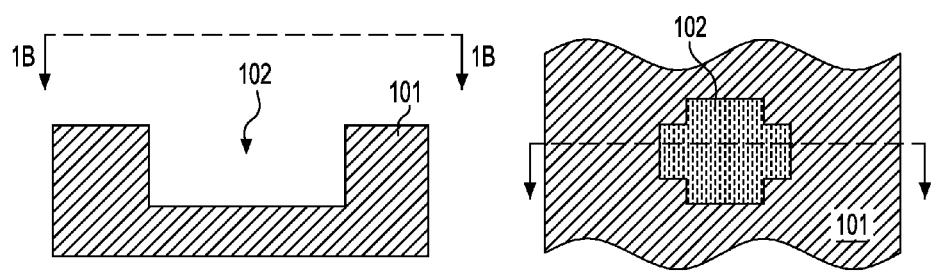
FIG. 1(a)
(PRIOR ART)
FIG. 1(b)
(PRIOR ART)
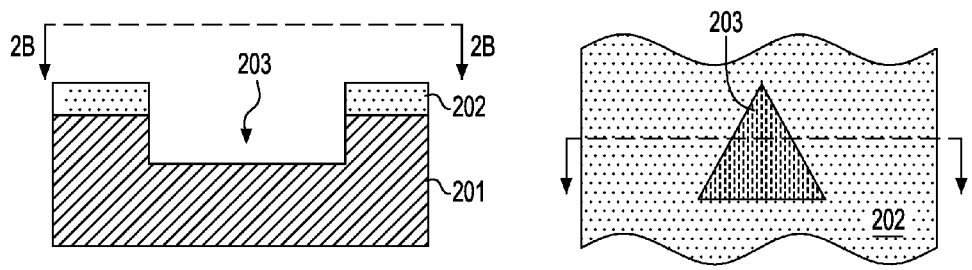
FIG. 2(a)
FIG. 2(b)

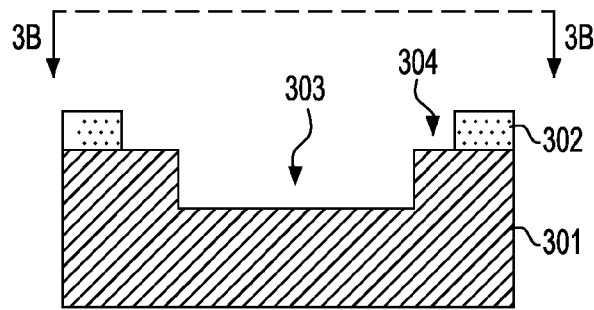
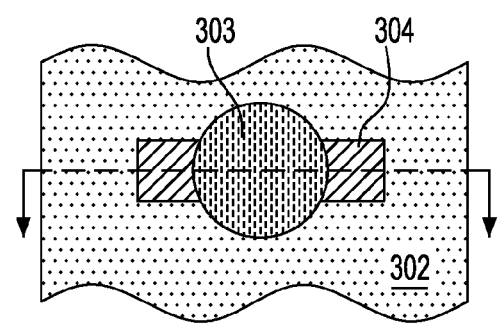
FIG. 3(a)  FIG. 3(b)
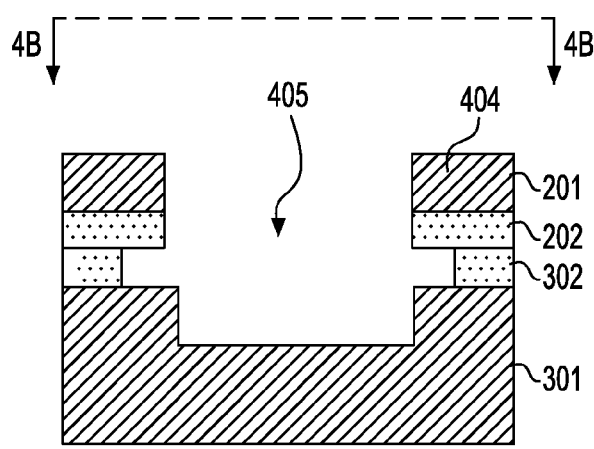
BONDED SUBSTRATE
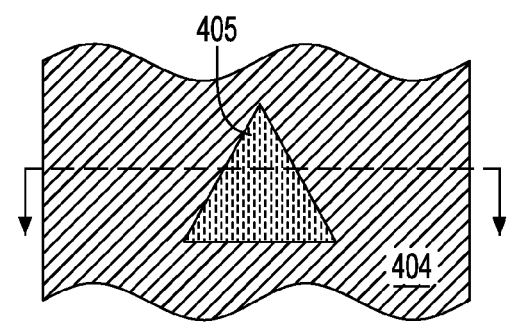
FIG. 4(a)  FIG. 4(b)

BONDED SUBSTRATES WITH FILL
AND OVERBURDEN

BONDED SUBSTRATES WITH
OVERBURDEN REMOVED

FINAL PART WITH MOLD REMOVED

BONDED SUBSTRATES WITH OVERBURDEN REMOVED

MOLD FOR FORMING COMPLEX 3D MEMS COMPONENTS

RELATED APPLICATION

The present application is a divisional of U.S. patent application Ser. No. 13/778,526, filed Feb. 27, 2013, entitled "DESIGN OF A MOLD FOR FORMING COMPLEX 3D MEMS COMPONENTS", the disclosure of which is incorporated by reference herein.

FIELD OF THE INVENTION

The present invention relates generally to micromachining and microfabrication, and more particularly, to a mold structure and associated fabrication method to form high-precision multi-dimensional components at the micro and millimeter scale, including components formed from metallic glass alloys.

BACKGROUND

Micro-electromechanical systems (MEMS) enable miniaturization of engineering systems and tools for a variety of applications due to their ability to create micro-scale systems having high sensitivity and low power consumption. Micro- and nano-scale components for a MEMS device may be fabricated concurrently as an integrated system, or components can be fabricated individually and then incorporated into a MEMS device. Advanced materials and fabrication techniques are required to produce highly precise multidimensional components for use in the MEMS devices.

Bulk metallic glasses are a class of material which can be used to fabricate components for MEMS devices. Bulk metallic glasses (BMGs) are amorphous metals that are rapidly quenched from a molten state to prevent crystal structure formation. A significant factor that determines the glass forming ability of a metal is the critical cooling rate. A sufficiently high critical cooling rate is required to bypass crystallization when cooling from a stable liquid phase in order to form a glass. Once in a glassy amorphous state, it is possible to complete a thermoplastic forming of BMGs at comparatively low temperatures using simplistic forming processes compared to traditional metals that result in near-net shaping. Thermoplastic forming is achieved by elevating the temperature of the BMG above the glass transition temperature followed by the application of pressure, which causes the BMG to conform to the shape of a mold patterned with the desired final features. Methods of thermoplastic forming of BMGs include but are not limited to hot embossing, blowmolding, and imprinting.

The complexity and precision of BMG components for use in MEMS devices is dependent of a mold structure used as part of the BMG processing. The methods of forming mold structures for metallic glass components with micro and nano-scale features offer the ability to produce a variety of highly-precise two-dimensional (2D) variation, but the resulting features are limited to a constant feature size, or minor variation of the 2D feature such as a taper angle, in the third dimension since the molds generally consist of a single substrate.

Referring now to FIG. 1a-1b, a cross-sectional view of a typical mold used to produce bulk metallic glass microscale components as known in the prior art is illustrated. A typical mold consists of a substrate 101, generally made of silicon. The top surface of substrate 101 contains a cavity 102 that is formed into the surface of substrate 101 using patterning processes known to those skilled in the art, including but not limited to photolithography and reactive ion etching, e.g., a RIE etching of the silicon substrate material. FIG. 1B shows a top view along line A-A (of FIG. 1A) illustrating cavity 102 formed in substrate 101. Due to the limitations of forming mold patterns on a single surface of a substrate, the molds existing in the prior art are limited to have a single two-dimensional feature as depicted in FIGS. 1A and 1B, having only features with a larger diameter than the nominal dimensions of cavity 102 on the top exposed surface of the mold. Mold cavity 102 is then filled with the desired high-temperature filling material, such as a bulk metallic glass alloy, by thermoplastic forming of the BMG into substrate 101. After removal of the mold substrate, the resulting BMG component features variation in two dimensions but only an extrusion of the 2D feature with no additional variation in the third dimension.

Mold structures with increased complexity can be formed by bonding stacked substrates to form a bonded mold. However, several limitations with bonded mold structures prohibit the use of metallic glass or other filling materials requiring elevated processing temperatures. For example, polymer-based adhesive materials that have been previously demonstrated as a way of bonding stacked silicon substrates induce thermal budget limitations on the filling materials that may be used. Since the processing temperature of zirconium-based and other metallic glass systems exceeds 400° C., a polymer-based adhesive would not be conducive for use in a bonded mold for many metallic glass forming applications. Additionally, the accuracy of features able to be produced using polymer-based adhesives to create a bonded mold is not precise due to the flow ability of polymer bonding agents during the substrate bonding process, which is typically completed using thermocompression bonding. The application of pressure at elevated temperatures required for successful thermocompression bonding of adhesives causes shifting of the substrates with respect to each other that can result in misalignment in excess of several microns. The flowability of the adhesive also causes local distortion of any patterned feature, which prohibits net-shape forming of feature with sharp angles or precise dimensions.

In the case of both 2D and 3D molds used for thermoplastic forming of BMGs, removing any residual BMG overburden from the top surface of the mold for highly precise micro and nano-scale parts remains a challenge. Removal methods known in the art such as grinding, polishing, and hot scraping may be applied as post-processing methods for larger-scale BMG components. However, for micro and nano-scale BMG components with highly precise features, the comparably large cross sectional area of the BMG overburden with respect to the final component exposed features can result in localized high forces that may cause delamination or distortion of the final BMG component during the overburden removal process.

BRIEF DESCRIPTION OF THE DRAWINGS

The present invention will be understood and appreciated more fully from the following detailed description of the invention, taken in conjunction with the accompanying drawings of which:

FIGS. 1A-1B show a conventional mold used to produce bulk metallic glass micro-scale components, as is known in the prior art;

FIGS. 2A-4B illustrate an exemplary embodiment of the structure and method of forming a three-dimensional mold having multiple patterned layers, according to an embodiment of the invention;

SUMMARY

Figure 5A:
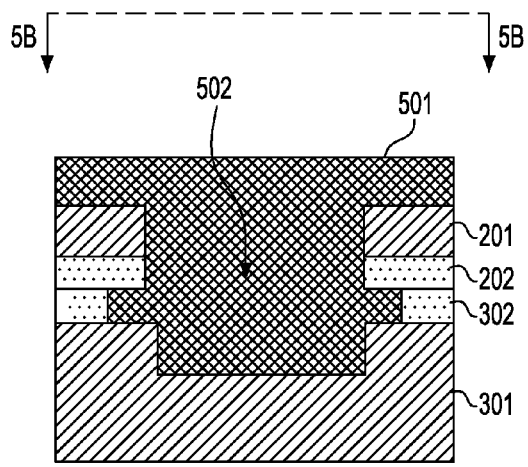
FIGS. 5A-5B illustrate an exemplary embodiment of the method of filling of three-dimensional mold having multiple patterned layers according to an embodiment of the invention.

In one aspect, an embodiment of the invention provides a silicon mold structure consisting of multiple silicon substrates patterned with a portion of an integrated design and bonded together using dielectric bonding in a sequential order to create a mold material with varying features in the x, y, and z-directions. The mold is then filled with bulk metallic glass using thermo-compression molding. The overburden of bulk metallic glass is removed from the fill side, and is followed by removing the silicon mold which leaves individual components with high-accuracy 3D features.

In another aspect, in one embodiment, multiple substrates with deposited oxide layer are patterned, including patterning one or more of the deposited oxide layers. The substrates are then positioned so that the deposited oxide layers in contact with each other, and an oxide-oxide fusion bonding process is completed such that a three-dimensional (3D) mold structure containing multiple patterned layers is formed. An opening in the top surface of the mold structure is formed exposing the internal mold cavity consisting of multiple patterned layers.

In another aspect, a first oxide layer on one semiconductor substrate only makes partial contact with a second oxide layer on a second semiconductor substrate such that a portion of the first oxide layer avoids contact with the second oxide layer, the portion of the first oxide layer being directly opposite a surface portion of the second semiconductor substrate wherein the surface portion of the second semiconductor substrate is free of said second oxide layer.

In another aspect, there is a gap between the portion of the first oxide layer and the surface portion of the second semiconductor substrate, the gap being filled with the filling material.

In still another aspect, in one embodiment, the cavity of three-dimensional mold structure is filled with material such as a metallic glass at elevated temperatures using thermoplastic formation. Any overburden of the filling material existing on the top surface of the mold structure is then removed, followed by the removal of the mold itself The resulting molded component is a highly-precise replication of the initial three-dimensional mold structure with multiple patterned layers.

In yet another aspect, an embodiment of the present invention enables the formation of structures with features that vary in the third dimension. By utilizing a deposited oxide layer as one of the patterned layers of the mold, very fine micron- and sub-micron scale variation in all three dimensions of the mold can be incorporated that would not be practical to achieve simply by adding an additional substrate.

In a further embodiment, the use of oxide as the bonding material and fusion bonding as the bonding method for the mold enables achievement of improved alignment accuracy of bonded substrates that is rendered possible since there is no bulk deformation or modification of the bond interface layers or the material that occurs during the bonding process, as is the case with adhesive or metal-metal bonding, resulting in a higher feature integrity in the final molded components. The use of oxide dielectrics as a bonding material further enables the use of bulk metallic glasses as a filling material for the complex mold since oxide dielectrics are thermally stable at the higher temperatures required to thermo-plastically form BMGs, where adhesive materials typically used for bonding of substrates are generally not thermally stable at the temperatures required thermo-plastically form BMGs. Additionally, oxide-oxide fusion bonding provides a significantly improved bonding quality and high percentage of bonded area across a substrate during at wafer-level processing, which enables large-scale, cost-effective fabrication of three-dimensional mold structures with multiple patterned layers.

In yet a further aspect, an embodiment provides the entire top substrate in the bonded stack that is in direct contact with the resulting overburden of filling material after the filling operation is removed, with the interface between the deposited oxide layer and the substrate material serving as an endpoint indicator.

Enablement of selective endpoint capability during the process of removing any excessive fill material remaining on the surface of the mold is made possible by using the interface of the oxide layer and substrate, which allows for high precision tolerances of micro scale components. Additionally, higher process yields are able to be achieved due to reduced deformation of BMG molded final work piece after molding, which results from minimizing the cross section of overburden to be removed, compared to non-selective direct removal of any overburden from the top surface of the mold by scraping or non-selective grinding processes.

The invention provides a method of forming a mold structure having high-precision multi-dimensional components that includes: forming a plurality of substrates patterned with at least one integrated design; bonding in sequential order the plurality of substrates using a patterned dielectric bonding layer to form a three dimension (3D) mold; and filling the 3D mold followed by an overburden removal of the mold using oxide layer endpoint.

The invention further provides a mold structure having high-precision multi-dimensional components comprising: a plurality of semiconductor substrates; an oxide layer superimposed on top of each substrate of the plurality of semiconductor substrates; integrated designs patterned in one or more of the oxide layers; and the plurality of semiconductor substrates bonded in sequential order, using dielectric bonding into a three dimensional (3D) mold, the 3D mold selectively filled with the filling material, and the molded component providing a precise replica of the 3D mold structure having multiple patterned layers.

DETAILED DESCRIPTION

Embodiments of the present invention will now be described in greater detail by referring to the following discussion and drawings that accompany the present application. It is noted that the drawings of the present application are provided for illustrative purposes only and, as such, they are not drawn to scale. In the following description, numerous specific details are set forth, such as the particular structures, components and materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

Referring to FIG. 2A, a cross-section view of an exemplary embodiment of a portion of a three-dimensional mold structure is illustrated with multiple patterned layers consisting of a first substrate 201 onto which an oxide layer 202 is formed.

In a preferred embodiment, substrate 201 is made of silicon. Substrate 201 may include silicon germanium, 3-5 group semiconductors, quartz, polymers or other organic compounds, and the like. Layer 202 may be formed using any dielectric material that can be fusion bonded. In an embodiment of the present invention, layer 202 is an oxide layer, which may include but is not limited to silicon dioxide material. Oxide layer 202 may be formed using methods commonly known in the art, including but not limited to chemical vapor deposition (CVD), plasma-enhanced chemical vapor deposition (PECVD), thermal oxidation, or spin-coating. The precursor for oxide layer 202 may consist of a silane-based precursor, tetraethyl orthosilicate (TEOS)-based precursor, or other precursor for dielectric materials. The thickness of oxide layer 202 may range from 100 nm to several millimeters, depending on the desired feature size.

A cavity 203 is formed through oxide layer 202 and extending into substrate 201. In a preferred embodiment, the cavity 203 may be extended through the substrate to the bottom surface of substrate 201. In an alternate embodiment, oxide layer 202 may also be patterned using a different pattern than that is used to pattern substrate 201. The cavity 203 may be formed by patterning processes which include but are not limited to photolithography and deep reactive ion etching, or RIE, of the substrate material. The formation of cavity 203 may be accomplished in one or more process steps, depending on the patterning processes required for the materials associated with substrate 201 and oxide layer 202, respectively.

FIG. 2B illustrates a top view along line A-A (of FIG. 2A) showing cavity 203 formed through the exposed top surface of oxide layer 202 disposed on substrate 201.

In parallel with the processing of first substrate 201 depicted in FIGS. 2A and 2B, a second substrate 301 is processed as depicted in FIGS. 3A and 3B. The second substrate 301 also has an oxide layer 302 deposited on the top surface. Similar to substrate 201, in a preferred embodiment, a second substrate 301 is shown using silicon. In other embodiments, substrate 301 may also be made of silicon germanium, III-V semiconductors, quartz, polymers or other organic compounds, or other materials known in the art. However, substrate 301 may be formed using a different material than substrate 201. Layer 302 may include any dielectric material that can be fusion bonded. In a preferred embodiment, layer 302 is an oxide layer, which may include but is not limited to silicon dioxide material. Oxide layer 302 may be formed using methods commonly known in the art, including but not limited to chemical vapor deposition (CVD), plasma-enhanced chemical vapor deposition (PECVD), thermal oxidation, or spin-coating. The precursor for oxide layer 202 may consist of a silane-based precursor, tetraethyl orthosilicate (TEOS)-based precursor, or other precursor for dielectric materials. The thickness of oxide layer 302 may range from 100 nm to several millimeters, depending on the desired feature size.

Unlike the pattern formed in the first substrate previously described, two cavities corresponding to cavities 303 and 304 are formed wherein different patterns are used for the respective cavities 303 and 304. Cavity 303 is formed with a first pattern in both substrate 301 and oxide layer 302, respectively, and a second pattern is used to form cavity 304 in oxide layer 302 only. Cavities 303 and 304 may be formed by patterning processes including but not limited to photolithography and deep reactive ion etching (RIE), of the substrate material. The formation of cavity 303 may be accomplished in one or more process steps, depending on patterning processes required for the materials associated with substrate 301 and oxide layer 302, respectively. Cavity 303 may have a depth ranging from less than 1 μtm to the full thickness of the substrate 301. It is to be understood that separate photolithography and etch steps may be required to pattern features 303 and 304, depending on the materials used for substrate 301 and dielectric layer 302.

FIG. 3B illustrates a top view along line A-A (of FIG. 3A) illustrating cavities 303 and 304 formed through the exposed top surface of oxide layer 302 disposed on substrate 301.

After completing the patterning substrates 201 and 301, both substrates are joined using fusion bonding of the oxide layers. By utilizing fusion-bonded oxide as a substrate joining method, a substrate alignment accuracy of less than 1 μm may be achieved, which is a significant improvement over polymer-based adhesives.

Referring to FIG. 4A, illustrating a cross section, in one embodiment, substrate 201 is inverted and joined face-to-face with substrate 301, In an alternate embodiment, substrates 201 and 301 may be aligned and joined face-to-back, using additional processing methods known in the art. Prior to fusion bonding, an activation process may be completed on the top exposed surfaces of dielectric layers 202 and 302. The activation process may include a wet chemical operation, plasma clean operation, or etch operation. After fusion bonding of the oxide layers 202 and 302, a thermal annealing operation may be performed. Additionally, after fusion bonding, if cavity 203 does not extend completely through substrate 201, the surface of substrate 201 that was the bottom exposed surface prior to bonding, which then becomes the top exposed surface of the bonded structure consisting of substrates 201 and 301 after fusion bonding, may be thinned to expose the bottom portion of cavity 203 that was formed in substrate 201. The thinning operation may be achieved by mechanical removal by grinding, chemical removal by wet etching or reactive ion etching (RIE), chemical mechanical planarization (CMP), or other substrate thinning methods. In a preferred embodiment, the thinning is accomplished with grinding.

The ability to fabricate molds having complex designs, such as significant undercuts formed by overhanging areas of the constituent mold layers, with high dimensional accuracy is a significant advantage of embodiments of the invention, which is achieved by the use of oxide as the bonding material and fusion bonding as the bonding methodology. Because of the thermal stability of oxide films, it is possible to create highly precise features in each of the oxide layers 202 and 302 that retain the design integrity once joined into a bonded mold structure at significantly higher temperatures than the same features formed in a bonded mold that uses an adhesive as bonding material. The ability to retain integrity of the features during bonding allows for designs that incorporate areas of overhang in which portions of the surfaces of the layers do not overlap, as illustrated in FIG. 4A. The result is a bonded mold that may contain comparably large precise undercuts in the design which would not be possible to produce in mold formed in a single substrate. It is to be understood that while FIG. 4A is not to scale, as long as a sufficient portion of the exposed surface area of oxide layers 202 and 302 are in physical contact and bonded, it is possible to create a mold design in which features exist that one oxide layer may overhang another without compromising the structural integrity of the mold.

Still referring to FIG. 4A, the resulting three-dimensional mold structure having multiple patterned layers is shown. Composite cavity 405 is formed following bonding accompanied by any required thinning operations. The top surface 404 of the bonded mold structure contains an exposed opening to composite cavity 405 in the exposed surface of substrate 201, which previously may have been the bottom surface of substrate 201.

Referring back to FIG. 4B, a top view along line A-A (of FIG. 4A) is depicted, with only one design layer of the composite mold cavity 405 visible from the top surface 404 of substrate 201, concealing the more complex structure of the mold existing in oxide layer 302 and substrate 301 in the bonded stack. After completing the three-dimensional mold structure with multiple patterned layers, filling and finishing operations may be completed to form a component with the shape of composite cavity 405.

Figure 5B:
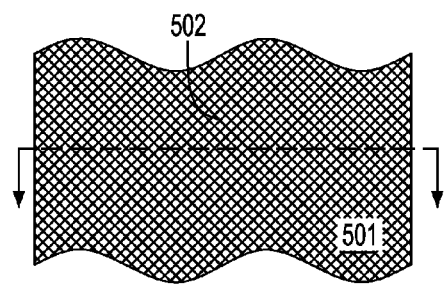

Referring now to FIG. 5A, the composite cavity 405 from FIG. 4a-4b is illustrated after completion of the filling operation. In one embodiment, the resulting filled cavity 502 may exceed the initial volume of cavity 405 due to the presence of additional overburden of the filling material to ensure adequate fill of the initial composite cavity 405. The presence of the overburden of the filling material on the top exposed surface of the mold is also depicted in FIG. 5B, which illustrates a top view along line A-A (of FIG. 5A). In an alternate embodiment, the filled cavity 502 will not cover the top exposed surface of substrate 201.

Filling cavity 405 and filled cavity 502 may be achieved by way of any material that may be formed thermoplastically. Additionally, due to the thermal stability of the oxide-oxide bond interface, the filling materials may be selected from those that require high processing temperatures wich may be feasible using adhesive-based bonding agents. In a preferred embodiment, the filled cavity 502 may consist of a bulk metallic glass (BMG) composition, including but not limited to BMGs with e.g., platinum-based, zirconium-based, palladium-based, iron-based, silver-based, magnesium-based, or other BMG systems of compositions known in the art. In an alternate embodiment, the filling material may consist of metal in liquid form. In another embodiment, the filling material may consist of polymer. In yet another alternate embodiment, the filling material may be a ceramic material.

Figure 6A:
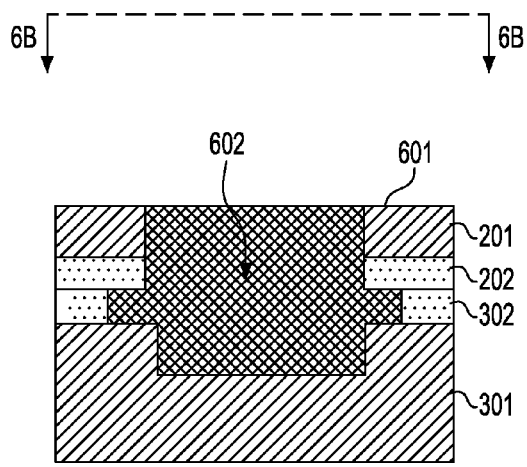
FIGS. 6A-6B illustrate a method of removing excess filling material from the three-dimensional mold having multiple patterned layers, according to an embodiment of the invention.
Figure 6B:
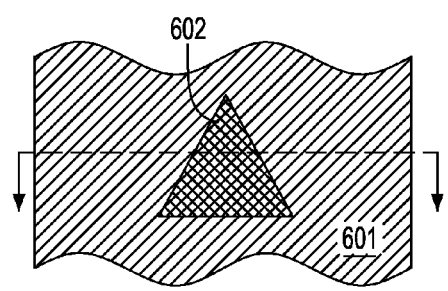

Referring now to FIGS. 6A and 6B, after filling the mold cavity with selected filling material, any additional overburden of the filling material that are present are preferably removed as illustrated in FIGS. 6A and 6B, the latter being a top view along line A-A the cross section as depicted in FIG. 6A. The filled mold cavity 602 with the overburden removed, as indicated by the exposure of substrate 201 as part of the top surface of the mold structure 601. In a preferred embodiment, the top exposed surface of filled mold cavity 602 is planar with the exposed surface of substrate 201. In another embodiment, the top exposed surface of the filled mold cavity 602 may be recessed below the exposed surface of substrate 201. Overburden removal methods may include but are not limited to mechanical removal by grinding, chemical removal by wet etching or reactive ion etching (RIE), chemical mechanical planarization (CMP), mechanical scraping at an elevated temperature, or other overburden removal method. The optimal overburden removal process may depend on the filling material selected for the molded component. In a preferred embodiment, mechanical grinding and CMP are employed as methods of overburden removal. In another embodiment, the interface between the fill material overburden and substrate 201 may be used as an indicator for endpoint detection methods associated with the overburden removal process.

Figures 7A, 7B:
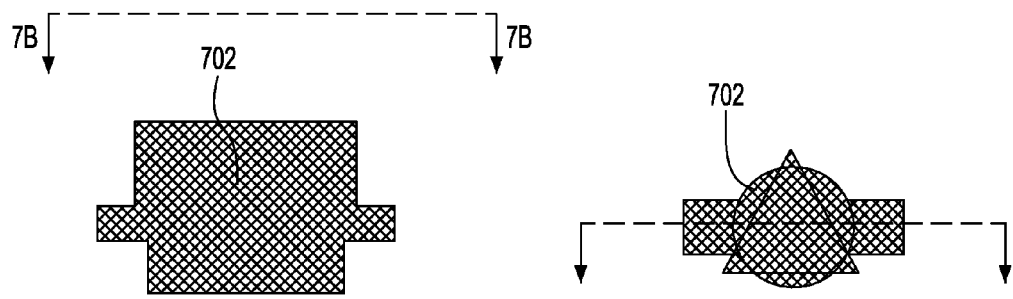
FIGS. 7A-7B is a final molded component resulting from the structure and method of forming and filling the three-dimensional mold having multiple patterned layers according to an exemplary embodiment of the invention.

Referring to FIGS. 7A and 7B, the final molded component resulting from the structure and method of forming and filling the three-dimensional mold having multiple patterned layers is illustrated, according to an exemplary embodiment of the invention after removal from the mold. As illustrated in FIG. 7A, depicting a cross-sectional view of the molded component, and FIG. 7B showing a top view along line A-A (of FIG. 7A). Mold removal methods preferably include but are not limited to chemical etching of the mold and mechanical fracturing of the mold, with the selected removal method resulting in the complete separation of the final molded component from the mold structure. In one embodiment, the chemical etching of the mold may be achieved using potassium hydroxide (KOH), using concentrations known to those skilled in the art. In an alternate embodiment other wet chemical agents may be used to etch the mold, including but not limited to TMAH, $NH_4OH$, HNA, SPIN-ETCH"B"™, or other chemical etchants, dependent on the substrate material selected for substrates 201 and 301.

Figures 8A, 8B:
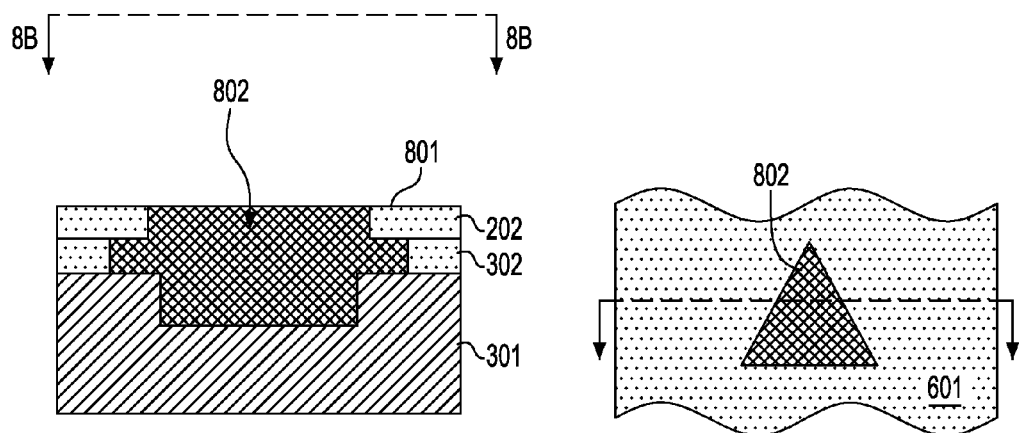
FIGS. 8A-8B illustrates an alternate exemplary method of removing excess filling material from the three-dimensional mold having multiple patterned layers according to an embodiment of the invention.

Referring to FIGS. 8A and 8B illustrate an embodiment showing an alternate exemplary method of removing the excess overburden of filling material from the three-dimensional mold having multiple patterned layers in which the interface between substrate 201 and oxide layer 202 is used as an endpoint indicator for the overburden removal process. As a result, substrate 201 is entirely removed from the mold, exposing the top surface of the mold consisting of the non-fusion bonded surface of oxide layer 202, as shown in the resulting structure depicted in FIGS. 8A and 8B, which illustrate the cross-sectional view and top view along line A-A (of FIG. 8A), respectively. In an alternate embodiment, the pattern formed in oxide layer 202 and the pattern formed in oxide layer 302 or substrate 301 may consist of the same pattern. When thin oxide layers are used, the use of the same pattern may allow for high precision and micron-scale final thickness of the final molded component resulting after the filled mold cavity 802 is released from the mold.

While the present disclosure has been particularly shown and described with respect to preferred embodiments thereof, it will be understood by those skilled in the art that the foregoing and other changes in forms and details may be made without departing from the scope and spirit of the present disclosure. It is therefore intended that the present disclosure not be limited to the exact forms and details described and illustrated, but fall within the scope of the appended claims.

What is claimed is:

1. A mold structure having high-precision multi-dimensional components comprising:
    a plurality of semiconductor substrates;

a first oxide layer superimposed on a top of a first semiconductor substrate of said plurality of semiconductor substrates;

a second oxide layer superimposed on a top of a second semiconductor substrate of said plurality of semiconductor substrates;

integrated designs patterned in at least one of said oxide layers; and said first and second semiconductor substrates bonded to one another by dielectric bonding into a three dimensional (3D) mold such that said first oxide layer only makes partial contact with said second oxide layer such that a portion of the first oxide layer avoids contact with the second oxide layer, the portion of the first oxide layer directly opposite a surface portion of the second semiconductor substrate, the surface portion of the second semiconductor substrate being free of said second oxide layer, said 3D mold selectively filled with a filling material to form a molded high-precision multi-dimensional component, the molded high-precision multi-dimensional component providing a precise replica of said 3D mold structure having multiple patterned layers.

2. The mold structure of claim 1 wherein said plurality of semiconductor substrates patterned with said integrated design is bonded together creating a mold material with varying 3D features.

3. The mold structure of claim 1 wherein said filling material comprises thermocompression molded bulk metallic glass.

4. The mold structure of claim 1 wherein overburden of bulk metallic glass is removed.

5. The mold structure of claim 1 further comprising said semiconductor substrates repositioned wherein said deposited oxide layers make contact with one another, and an oxide-oxide fusion bonding completed with said 3D mold structure containing multiple patterned layers.

6. The mold structure of claim 1 wherein each of said first oxide layer and said second oxide layer is a silane based oxide and said filling material comprises a bulk metal glass.

7. The mold structure of claim 1 wherein there is a gap between the portion of the first oxide layer and the surface portion of the second semiconductor substrate, the gap being filled with the filling material.

8. The mold structure of claim 1 wherein the 3D mold comprises a mold cavity and the surface portion of the second semiconductor substrates is within the mold cavity.

9. A mold structure having high-precision multi-dimensional components comprising:

a plurality of semiconductor substrates;

a first oxide layer superimposed on a top of a first semiconductor substrate of said plurality of semiconductor substrates;

a second oxide layer superimposed on a top of a second semiconductor substrate of said plurality of semiconductor substrates;

integrated designs patterned in at least one of said oxide layers; and said first and second semiconductor substrates bonded to one another by dielectric bonding into a three dimensional (3D) mold such that said first oxide layer only makes partial contact with said second oxide layer such that a portion of the first oxide layer avoids contact with the second oxide layer, wherein there is a gap between the portion of the first oxide layer and the second semiconductor substrate, the gap being filled with the filling material, said 3D mold selectively filled with a filling material to form a molded high-precision multi-dimensional component, the molded high-precision multi-dimensional component providing a precise replica of said 3D mold structure having multiple patterned layers.

10. The mold structure of claim 9 wherein said plurality of semiconductor substrates patterned with said integrated design is bonded together creating a mold material with varying 3D features.

11. The mold structure of claim 9 wherein said filling material comprises thermocompression molded bulk metallic glass.

12. The mold structure of claim 9 wherein overburden of bulk metallic glass is removed.

13. The mold structure of claim 9 further comprising said semiconductor substrates repositioned wherein said deposited oxide layers make contact with one another, and an oxide-oxide fusion bonding completed with said 3D mold structure containing multiple patterned layers.

14. The mold structure of claim 9 wherein each of said first oxide layer and said second oxide layer is a silane based oxide and said filling material comprises a bulk metal glass.

15. The mold structure of claim 9 wherein the 3D mold comprises a mold cavity and the gap is within the mold cavity.

* * * * *